(12) United States Patent
Kim

(10) Patent No.: US 6,762,959 B2
(45) Date of Patent: Jul. 13, 2004

(54) LOW-POWER NONVOLATILE SEMICONDUCTOR MEMORY DEVICE

(75) Inventor: Myong-Jae Kim, Kyunggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/219,506

(22) Filed: Aug. 14, 2002

(65) Prior Publication Data

US 2003/0048689 A1 Mar. 13, 2003

(30) Foreign Application Priority Data

Aug. 28, 2001 (KR) .......................... 2001-52058

(51) Int. Cl.[7] ................................................ G11C 7/00
(52) U.S. Cl. ........................... 365/189.09; 365/185.18; 365/226
(58) Field of Search ..................... 365/189.09, 226, 365/185.18, 185.23, 230.06, 185.17

(56) References Cited

U.S. PATENT DOCUMENTS 6,018,479 A * 1/2000 Jeong .................... 365/189.11
6,128,231 A * 10/2000 Chung ................... 365/185.23
6,535,425 B2 * 3/2003 Nawaki et al. ........ 365/185.18

FOREIGN PATENT DOCUMENTS

JP 09-297997 11/1997
KR 2000-33377 6/2000

OTHER PUBLICATIONS

English language of Abstract for Korean Patent Publication No. 2000–33377, published on Jun. 15, 2000.

English language of Abstract for Japanese Patent Publication No. 09–297997, published on Nov. 18, 1997.

* cited by examiner

Primary Examiner—Gene Auduong
(74) Attorney, Agent, or Firm—Marger Johnson & McCollom

(57) ABSTRACT

The disclosure is a nonvolatile semiconductor memory including bitlines connected to memory cells and high-voltage specified NMOS transistors connecting the bitlines to sense amplifiers. Column selection signals applied to the NMOS transistors are established at a voltage higher than a power supply voltage during a read operation. In the case of power supply voltage drain, the invention prevents degradation of the drivability of the NMOS transistors.

14 Claims, 8 Drawing Sheets

LOW-POWER NONVOLATILE SEMICONDUCTOR MEMORY DEVICE

This application claims priority from Korean Patent Application No. 2001-52058, filed on Aug. 28, 2001, the contents of which are herein incorporated by this reference in their entirety.

TECHNICAL FIELD

The present invention is generally concerned with semiconductor memory devices and, more specifically, with nonvolatile semiconductor memory devices with the operation modes of erasing, programming, and reading, using a voltage higher than a power supply voltage.

BACKGROUND OF THE INVENTION

Referring to FIG. 1, as a kind of nonvolatile semiconductor memory devices, a NOR-type flash memory includes a memory cell array 10, a row (X) decoder 20, a column gate circuit 30, a column (Y) decoder 40, and sense amplifiers/write drivers (SA/WD) block 50, in general.

The NOR-type memory cell array 10 comprises of plural memory cells coupled to wordlines WL and bitlines BL in a matrix pattern. Each memory cell, as shown in FIG. 2, is constructed of a stacked gate type for example, being made of source and drain regions formed in a P-type semiconductor substrate 2, 3 and 4, a floating gate 6 isolated from the source and drain regions through an oxide film 7 thinner than 100 Å, and a control gate 8 formed over the floating gate 6 with an interlayer oxide film 9 interposed therebetween. The NOR-type flash memory has a multiplicity of bulk regions, isolated from each other, in which the memory cells are formed. Therefore, memory cells in the same bulk region are erased simultaneously in the unit of bulk, so referred to as a "sector" that for example covers the storage capacity of 64 Kb.

Returning to FIG. 1, a row decoder 20 selects one of wordlines WL1~WLi in response to a row address, and a column gate circuit 30 selects a part of bitlines BL1~BLj in response to column selection signals Y1~Yn provided from a column decoder 40. The selected bitlines are connected to the SA/WD block 50. The column gate circuit 30 is constructed of high-voltage specific NMOS transistors, T11~Tn1, T12~Tn2, . . . , T1m~Tnm, which are connected to the bitlines BL1~BLj each of which corresponds to a group of the n-numbered transistors. The SA/WD block 50 senses data from a selected memory cell through its corresponding bitline during a read operation while it drives data into a selected memory cell during a program operation.

The following Table 1 shows voltage biasing states for performing relevant operations in the NOR-type flash memory.

TABLE 1

| Operation Mode | Vg | Vd | Vs | Vb |
|---|---|---|---|---|
| Programming | +10 V | +5 V~+6 V | 0 V | 0 V |
| Erasing | −10 V | Floating | Floating | +6 V |
| Erase Repair | +3 V | +5 V~+6 V | 0 V | 0 V |
| Read | +4.5 V | +1 V | 0 V | 0 V |

Programming a memory cell involves hot electron injection by which a ground voltage (i.e., 0V) is applied to the source and substrate, a high voltage (e.g., +10V) to the control gate, and an appropriate positive voltage (e.g., +5~6V) to the drain region. The high positive voltage Vg, applied to control gates of memory cell transistors, is supplied from the row decoder 20. The positive voltage to the drain region, Vd, is supplied from the write driver 50 through the column gate circuit 30 in which a positive voltage of +5V~+6V is applied to gates of the selected NMOS transistors among T11~Tnm. With the voltage biases, electrons (or negative charges) accumulate in the floating gate, resulting in an elevation of the transistor's threshold voltage. A programmed memory cell has a threshold voltage of +6V~+7V, being detected as an "off-cell" when read.

Erasing the memory cells involves the Fowler-Nordheim (F-N) tunneling effect. A high (-potential) negative voltage of about −10V is applied to gates of memory cells while an appropriate positive voltage of about +5V biases the substrate (or bulk) of the memory cells. The drain region of the memory cell is in a floating state (or a high-impedance state) in order to maximize an erasing effect. The high negative voltage applied to the control gate of the memory cell is supplied from the row decoder 20. Under the condition of voltage-biasing to erase the memory cells, a strong electric field of 6~7 MV/cm over the oxide film 7 between the floating gate 6 and the substrate 2 induces the F-N tunneling, thus reducing a threshold voltage of the memory cell. The erased memory cell is detected as an "on-cell".

Reading a memory cell to distinguish a current state of the memory cell is achieved by applying an appropriate positive voltage of about +1V to the drain region 4, applying a positive voltage of about +4.5V to the control gate through a selected wordline, and applying 0V to the source region. The drain voltage (Vd) is supplied from the sense amplifier of the SA/WD block 50 through the column gate circuit 30, and the gate voltage (Vg) is supplied from the row decoder 20. If a selected memory cell has been programmed, there is no current flow through the programmed memory cell because its threshold voltage was set higher. Therefore, a voltage on a corresponding bitline increases and the sense amplifier detects the memory cell as an off-cell. On the other hand, if a selected memory cell has been erased, a current flows from the source region to the drain region, and a decreased voltage on a corresponding bitline lets the sense amplifier detect the memory cell as an on-cell.

As a high voltage beyond 5V is applied to the drain region during the program operation, the column gate circuit 30 employs high-voltage specified NMOS transistors (hereinafter, referred to as "HVNMOS transistors") T11~Tnm in order to transfer the high voltage to the memory cells in full rate. Such a HVNMOS transistor is operative at a higher voltage than a power supply voltage, with a thick gate oxide film by which its threshold voltage is about +3V higher than a normal NMOS transistor having a threshold voltage of +0.5~+0.7V.

During a read operation, the voltage level around the power supply voltage, e.g., 3~5V, is established on a gate of the HVNMOS transistor in order to transfer the drain voltage of 1V to the drain region of the selected memory cell. However, if the power supply voltage becomes lower, the current drivability of the HVNMOS transistor degrades and accordingly the reading speed decreases. As a result, high-speed operation of the NOR flash memory device is impeded.

SUMMARY OF THE INVENTION

Embodiments of the present invention provide a nonvolatile memory device maintaining higher reading speed for memory cells which using a lower power supply voltage.

Features and advantages of embodiments the invention will be more fully described by reference to the accompanying drawings.

BRIEF DESCRIPTION OF THE DRAWINGS

A more complete understanding of the present invention, and many of the attendant advantages thereof, will become readily apparent by reference to the following detailed description when considered in conjunction with the accompanying drawings in which like reference symbols indicate the same or similar components, wherein.

DESCRIPTION OF THE PREFERRED EMBODIMENTS

In the following description for purposes of explanation, specific numbers, materials and configurations are set forth in order to provide a thorough understanding of the present invention. However, it will be apparent to one skilled in the art that the present invention may be practiced without the specific details. In other instances, well-known systems are shown in diagrammatic or block diagram form in order not to obscure the present invention.

Figure 1:
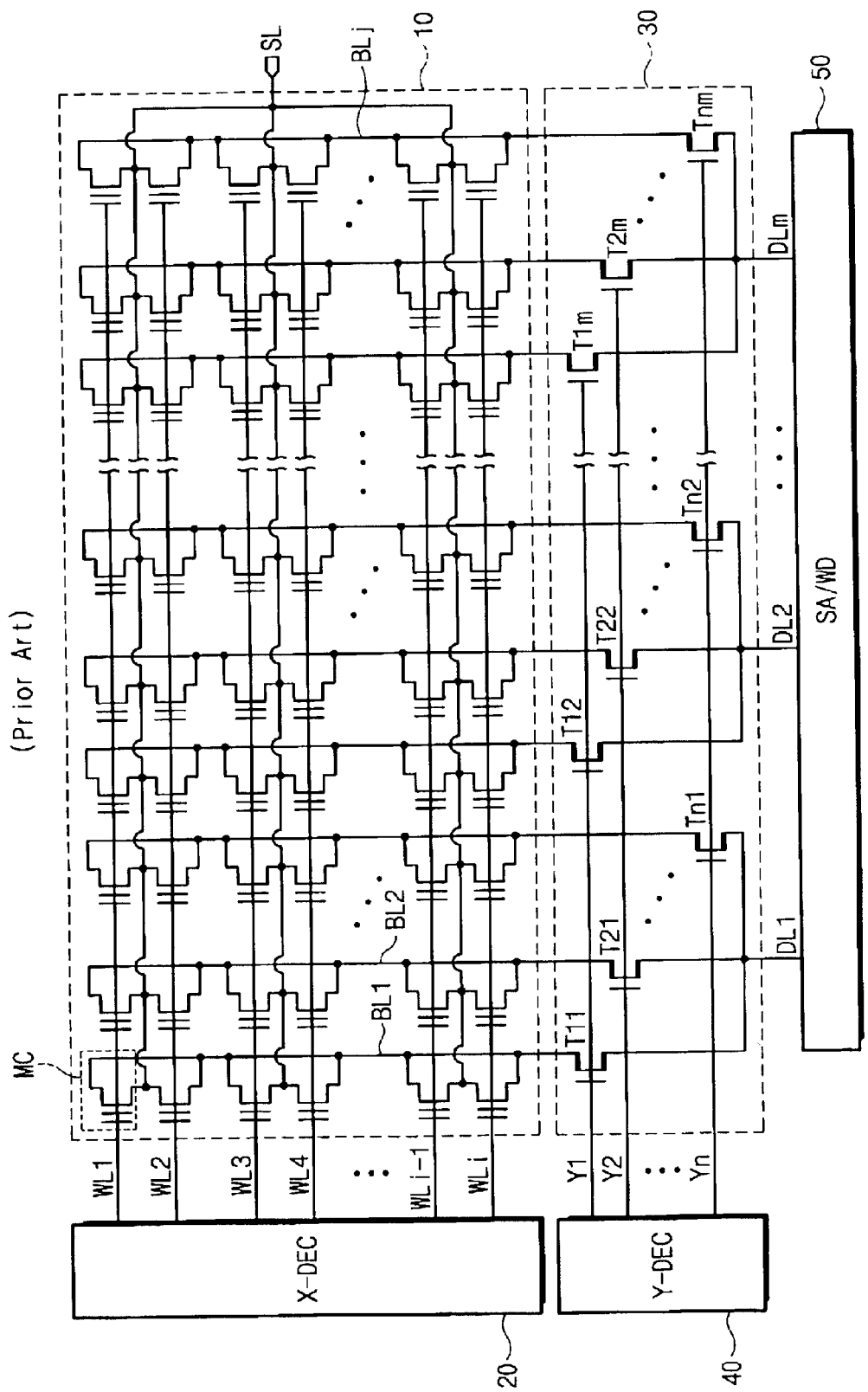
FIG. 1 is a schematic diagram showing a structure of a traditional nonvolatile semiconductor memory device.
Figure 2:
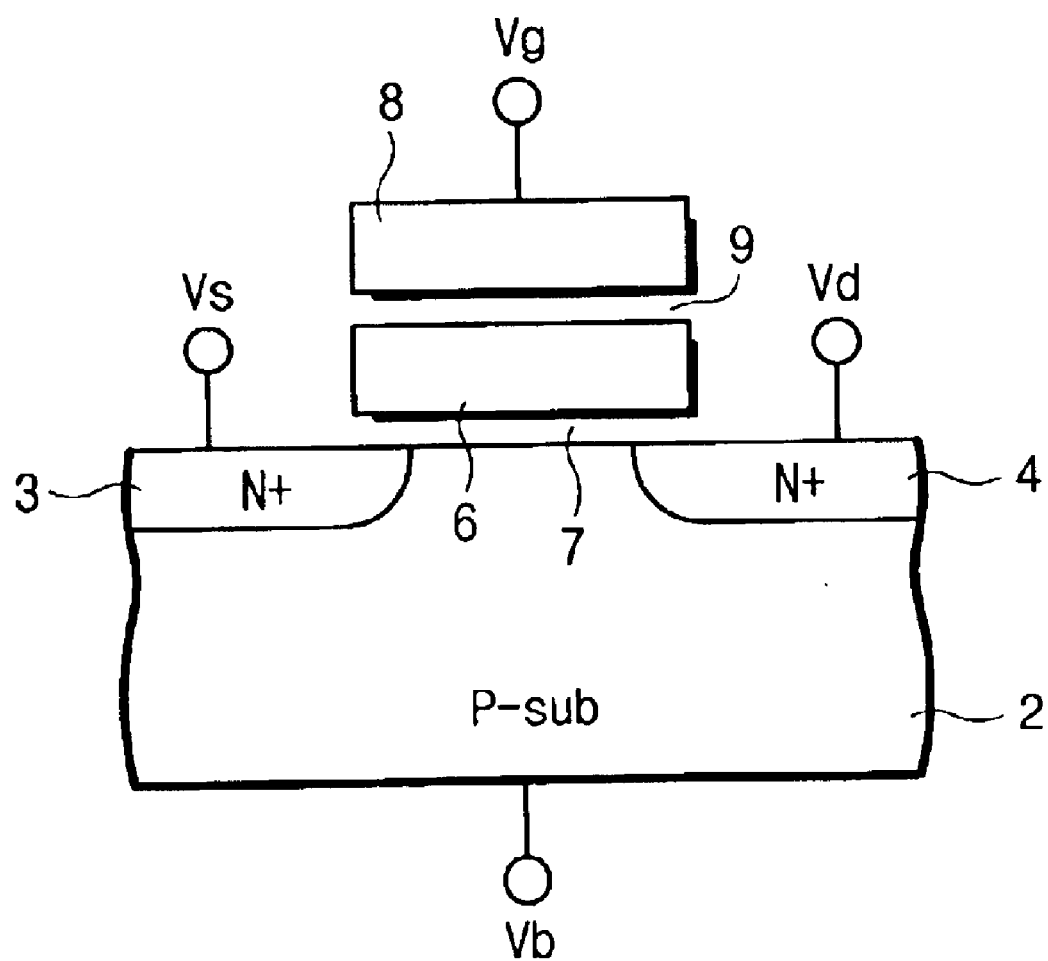
FIG. 2 is a sectional schematic diagram of a memory cell of the device shown in FIG. 1.
Figure 3:
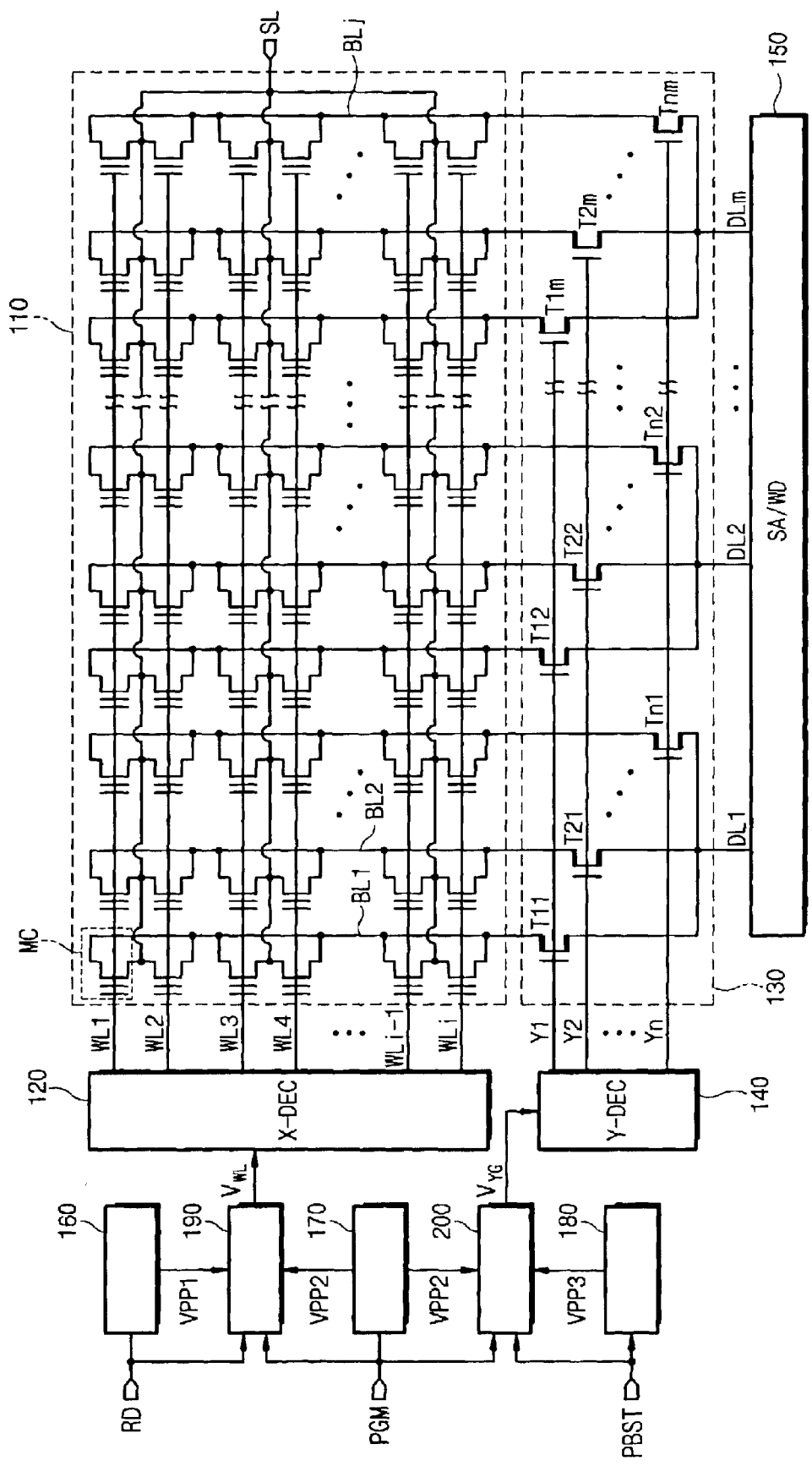
FIG. 3 is a schematic block diagram showing a nonvolatile semiconductor memory device according to the invention, including a structure of a memory cell array, voltage generators, and switch circuits.

Referring to FIG. 3, a NOR flash memory 100 according to the present invention includes a memory cell array 110, a row decoder (X-DEC) 120, a column gate circuit 130, a column decoder (Y-DEC) 140, a sense-amp/write-driver (SA/WD) block 150, a read voltage generator 160, a program voltage generator 170, a voltage booster 180, a wordline voltage switch circuit 190, and a column-gating voltage switch circuit 200. The memory cell array 110 is composed of a plurality of stacked gate memory cells MC (shown in FIG. 2) coupled to wordlines WL1~WLi, bitlines BL1~BLj, and a common source line SL. The wordlines WL1~WLi are connected to the row decoder 120 that selects one of the wordlines and supplies a wordline voltage thereto. The bitlines BL1~BLj are connected to the column gate circuit 130 that connects a portion of the bitlines to the SA/WD block 150 in response to column selection signals Y1~Yn provided from the column decoder 140. The column gate circuit 130 is composed of HVNMOS transistors T11~Tnm each of which is connected between a corresponding bitline and the SA/WD block 150. Each HVNMOS transistor is operable in a high-voltage condition, with a threshold voltage of about 3V. The HVNMOS transistors T11~Tnm are arrayed in groups of in transistors connected to data lines DL1~DLm connected, in turn, to the SA/WD block 150.

The read voltage generator 160 generates a read voltage VPP1 in response to a read signal RD, and the program voltage generator 170 generates a program voltage VPP2 in response to a program signal PGM. The read voltage VPP1 is applied to a selected wordline as the wordline voltage $V_{WL}$ during a read operation, while the program voltage VPP2 is applied to a selected wordline as the wordline voltage $V_{WL}$ during a program operation, commonly through the switch circuit 190 and the row decoder 120. The switch circuit 190 selectively transfers one of the read voltage VPP1 and the program voltage VPP2 in response to the program signal PGM. The row decoder 120 transfers the wordline voltage $V_{WL}$, which is selected from a read voltage VPP1 or the program voltage VPP2, in response to address information. The program voltage VPP2 is also provided to the column-gating voltage switch circuit 200. The voltage booster 180 generates a column-gating voltage VPP3 in response to a boosting signal PBST. The column-gating voltage switch circuit 200 transfers one of the program voltage VPP2 and the column gating voltage VPP3 alternatively in response to the program signal PGM and the boosting signal PBST.

The read signal RD activates a read operation mode while the program signal PGM activates a program operation mode. The read voltage VPP1, the program voltage VPP2, and the column-gating voltage VPP3, all higher than a power supply voltage (VCC), are established at about 4.5 V, 10 V, and VCC+Vth (Vth is a threshold voltage of the HVNMOS transistor), respectively.

Figure 4:
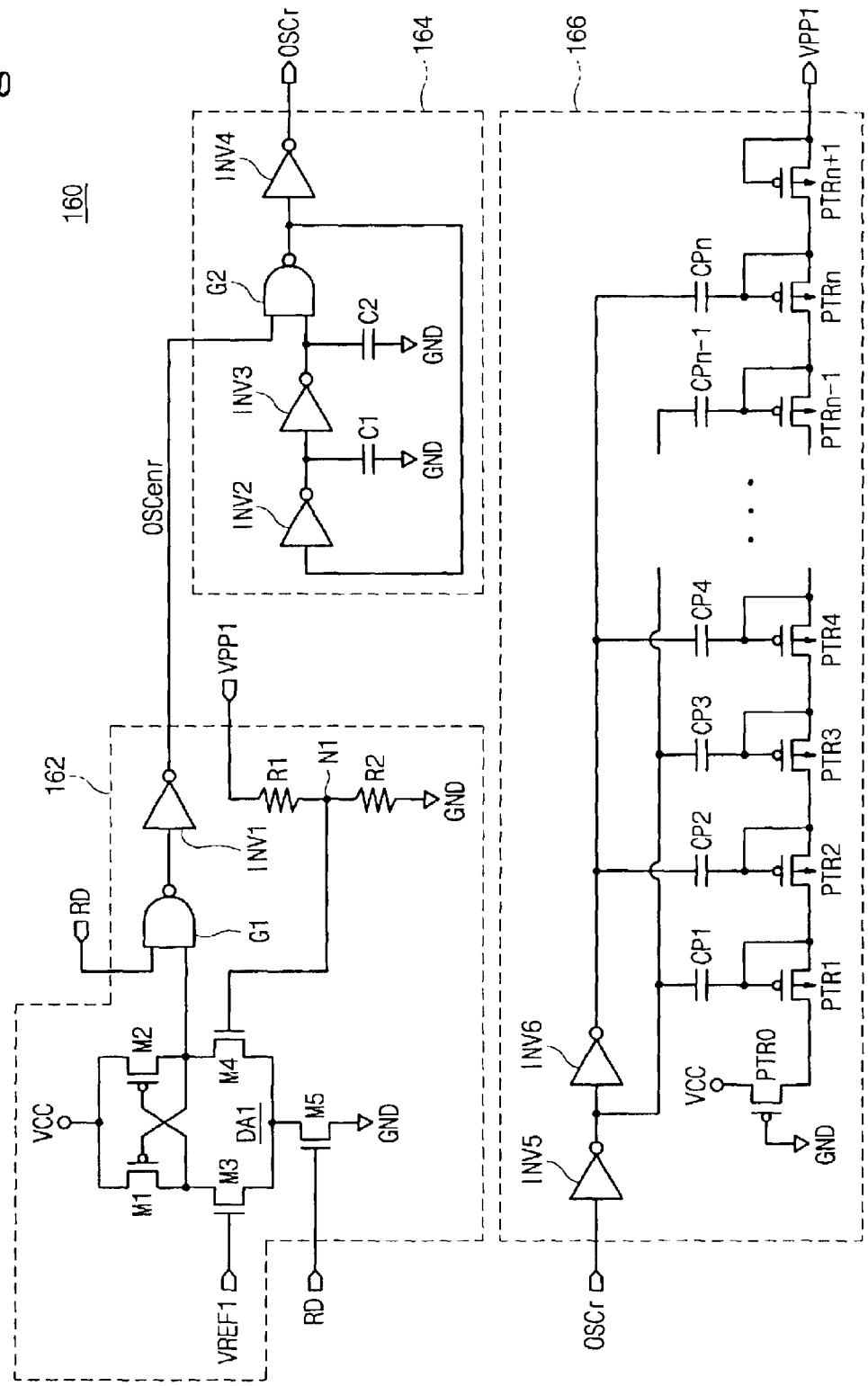
FIG. 4 is a circuit diagram of a first high-voltage generator shown in FIG. 3.

Referring now to FIG. 4, the read voltage generator 160 comprises an oscillation controller 162, an oscillator 164, and a charge pump 166. The oscillation controller 162 comprises a differential amplifier DA1 constructed of PMOS transistors M1 and M2 and NMOS transistors M3~M5, resistors R1 and R2 serially connected between VPP1 and a ground voltage GND, a NAND gate G1 receiving an output of the differential amplifier DA1 and the read signal RD, and an inverter INV1 converting an output of the NAND gate G1 into an oscillation enable signal OSCenr. In the differential amplifier DA1, a gate of the NMOS transistor M4 is coupled to a voltage node N1 between the resistors R1 and R2, and a gate of the NMOS transistor M3 is coupled to a reference voltage VREF1. A gate of the NMOS transistor M5 that connects the differential amplifier DA1 to the ground voltage is coupled to the read signal RD so as to control an activation of the differential amplifier DA1. The oscillation controller 162 determines whether a present level of the read voltage VPP1 reaches a predetermined voltage level defined by the reference voltage VREF1. If VPP1 is lower than VREF1, the oscillation enable signal OSCenr is active with a high level. To the contrary, if VPP1 is higher than VREF1, OSCenr is inactive with a low level.

The oscillator 164 is formed of inverters INV2—INV4, capacitors C1 and C2, and a NAND gate G2, generating a pumping clock OSCr in response to OSCenr of a high level. The pumping clock OSCr is a signal oscillating with a predetermined cycle period. When OSCenr is a low level, the oscillator 164 does not generate the pumping clock OSCr.

The charge pump 166 is composed of inverters INV5 and INV6, capacitors CP1~CPn, and PMOS transistors PTR1~PTRn+1. The pumping clock OSCr is applied to the capacitors CP1~CPn in turn with the order of even and odd, so that the read voltage VPP1 is charged up by the serial action of the pumping chain along the oscillation of the pumping clock OSCr.

Figure 5:
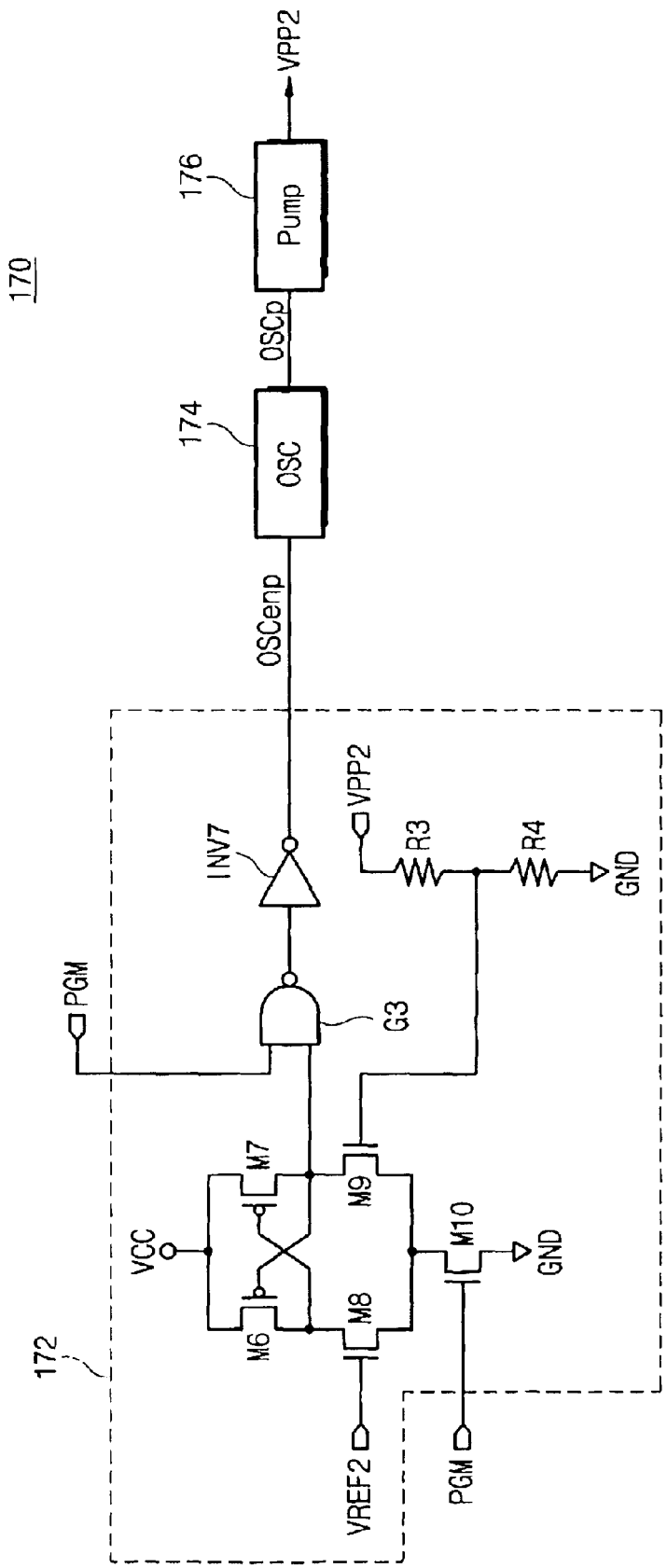
FIG. 5 is a circuit diagram of a second high-voltage generator shown in FIG. 3.

Referring to FIG. 5, the program voltage generator 170 comprises an oscillation controller 172, an oscillator 174, and a charge pump 176. Program voltage generator 170 is similar to the read voltage generator 160 except that resistors R3 and R4 (corresponding to R1 and R2) connected between the program voltage VPP2 and the ground voltage GND and an NMOS transistor M10 (corresponding to M5) responds to the program signal PGM. The oscillation controller 172 determines whether a present level of the program voltage VPP2 reaches a predetermined voltage level defined by the reference voltage VREF2. If VPP2 is lower than VREF2, the oscillation enable signal OSCenp is active with a high level. To the contrary, if VPP2 is higher than VREF2, OSCenp is inactive with a low level.

The oscillator 174 generates a pumping clock OSCp in response to OSCenp of a high level. The pumping clock OSCp is a signal oscillating with a predetermined cycle period. When OSCenp is a low level, the oscillator 174 does not generate the pumping clock OSCp. The program voltage VPP2 generated from the charge pump 176 is gradually charged up to the predetermined level, i.e., 10V, with the oscillation of the pumping clock OSCp.

Figure 6:
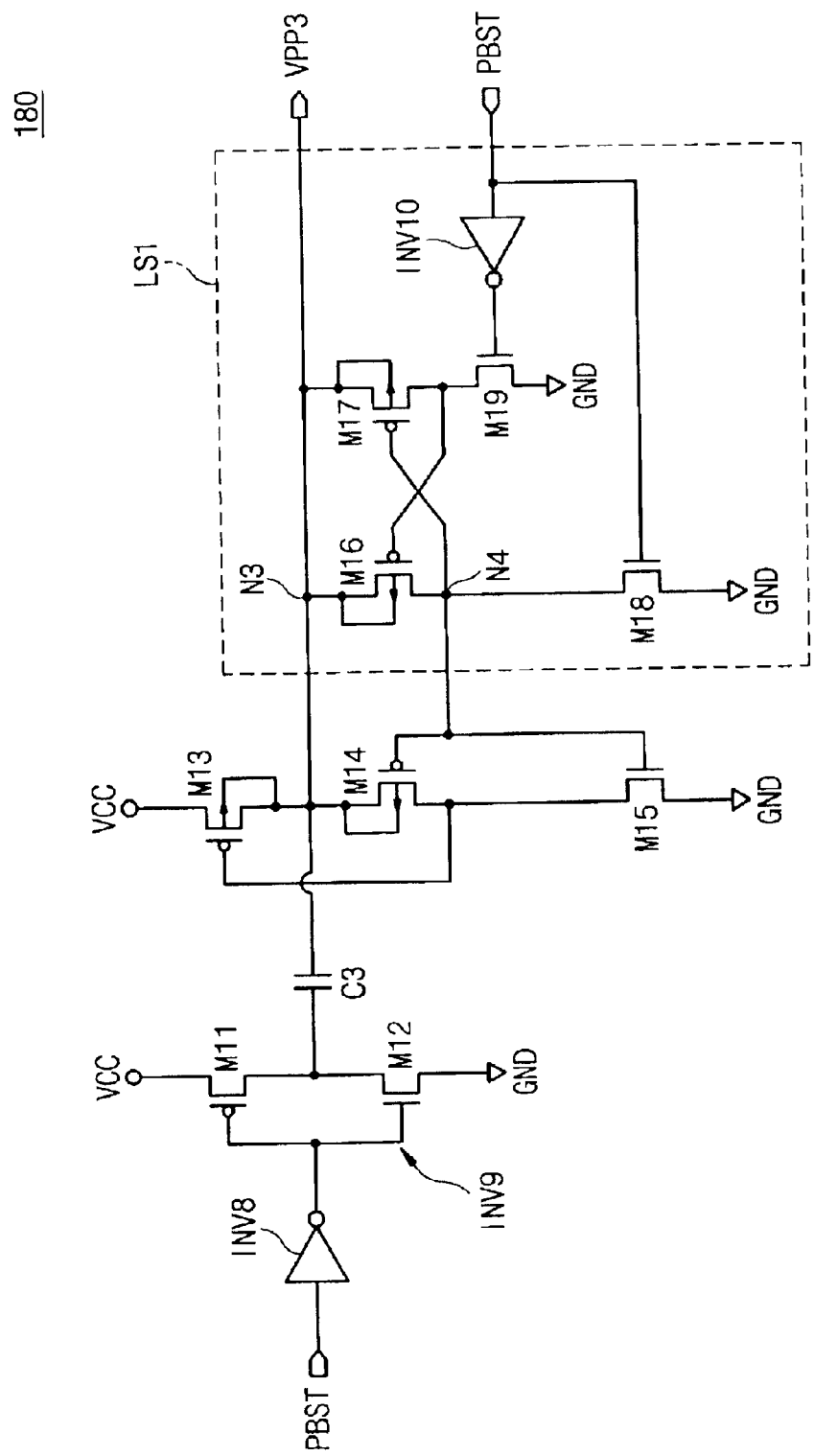
FIG. 6 is a circuit diagram of a voltage booster shown in FIG. 3.

Referring to FIG. 6, in the voltage booster 180, the boosting signal PBST is applied to a boosting capacitor C3 through inverters INV8 and INV9 (comprising serially connected PMOS transistors M11, M12) serially connected. The other electrode of the capacitor C3 is connected to an output terminal N3 from which the column-gating voltage VPP3 is generated. Between VCC and the output terminal N3 is connected a PMOS transistor M13, and between the output terminal N3 and the ground voltage GND is connected a PMOS transistors M14 and an NMOS transistor M15. A gate of the PMOS transistor M13 is coupled to a common drain node of the transistors M14 and M15 whose gates are coupled to an output node N4 of a level shifter LS1. The level shifter LS1 is formed of PMOS transistors M16 and M17, NMOS transistors M18 and M19, and an inverter INV10. Sources of the PMOS transistors M16 and M17 are connected to the output terminal N3. The boosting signal PBST is applied directly to a gate of the NMOS transistor M18 and indirectly to a gate of the NMOS transistor M19 through the inverter 10. When the boosting signal PBST is a low level, VPP3 is set at VCC by the PMOS transistor M13 that maintains a conductive state because the output node N4 is a high level. When the boosting signal PBST rises to a high level, VPP3 is charged up to the voltage level of VCC+Vth in accordance with a coupling ratio at the output terminal N3.

Figure 7:
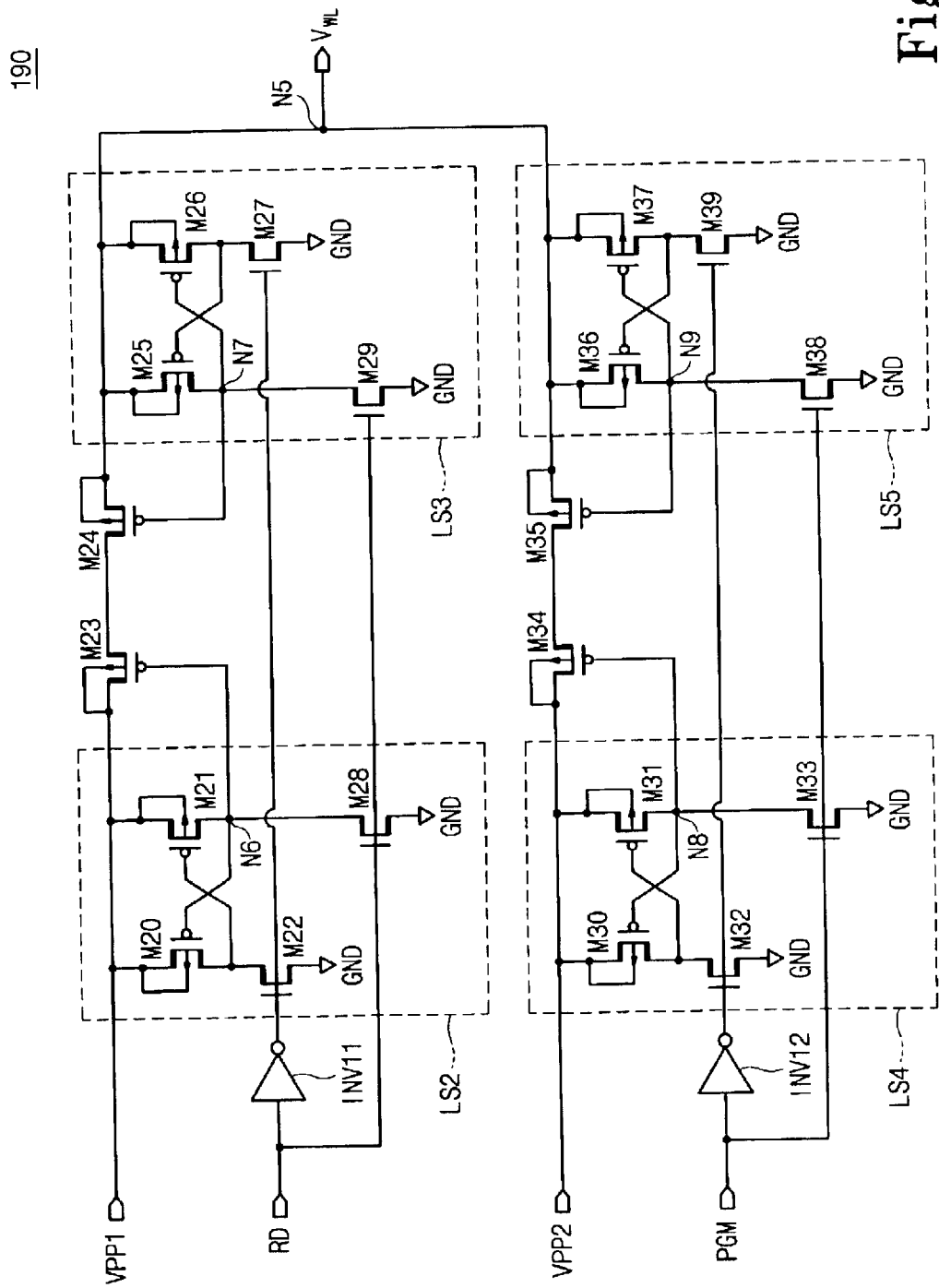
FIG. 7 is a circuit diagram of a first switch circuit shown in FIG. 3.

Turning now to FIG. 7, the wordline voltage switch circuit 190 employs HVMOS transistors M20~M39 to transfer the high voltages such as VPP1 and VPP2. It is formed of an inverter INV11 converting the read signal RD to its complementary logic level, a level shifter LS2 connected between VPP1 and GND and responding to the read signal RD, a level shifter LS3 connected between VPP1 and GND and responding also to the read signal RD, HVPMOS transistors M23 and M24 connected in series between the VPP1 and an output terminal N5 from which the wordline voltage VWL is output, an inverter INV12 converting the program signal PGM to its complementary logic level, a level shifter LS4 connected between VPP2 and GND and responding to the program signal PGM, a level shifter LS5 connected between VPP2 and GND and responding to the program signal PGM, and HVPMOS transistors M34 and M35 connected in series between the VPP2 and the output terminal N5. Gates of the HVPMOS transistors M23 and M24 are coupled to output nodes N6 and N7 of the level shifters LS2 and LS3, respectively. Gates of the HVPMOS transistors M34 and M35 are coupled to output nodes N8 and N9 of the level shifters LS4 and LS5, respectively.

When the read voltage RD is active with a high level, the HVPMOS transistors M23 and M24 are turned on respectively by the level shifters LS2 and LS3. Then, the read voltage VPP1 is transferred to the row decoder 120 through the conductive HVPMOS transistors M23 and M24 as the wordline voltage $V_{WL}$. During this time, as the program signal PGM is inactive with a low level, VPP2 cannot affect the wordline voltage $V_{WL}$ because the HVPMOS transistors M34 and M35 are in non-conductive states. In contrast, when the program voltage PGM is active with a high level, the HVPMOS transistors M34 and M35 are turned on respectively by the level shifters LS4 and LS5. Then, the program voltage VPP2 is transferred to the row decoder 120 through the conductive HVPMOS transistors M34 and M35 as the wordline voltage $V_{WL}$. During this time, as the read signal RD is inactive with a low level, VPP1 cannot affect the wordline voltage $V_{WL}$ because the HVPMOS transistors M23 and M24 are in non-conductive states.

Figure 8:
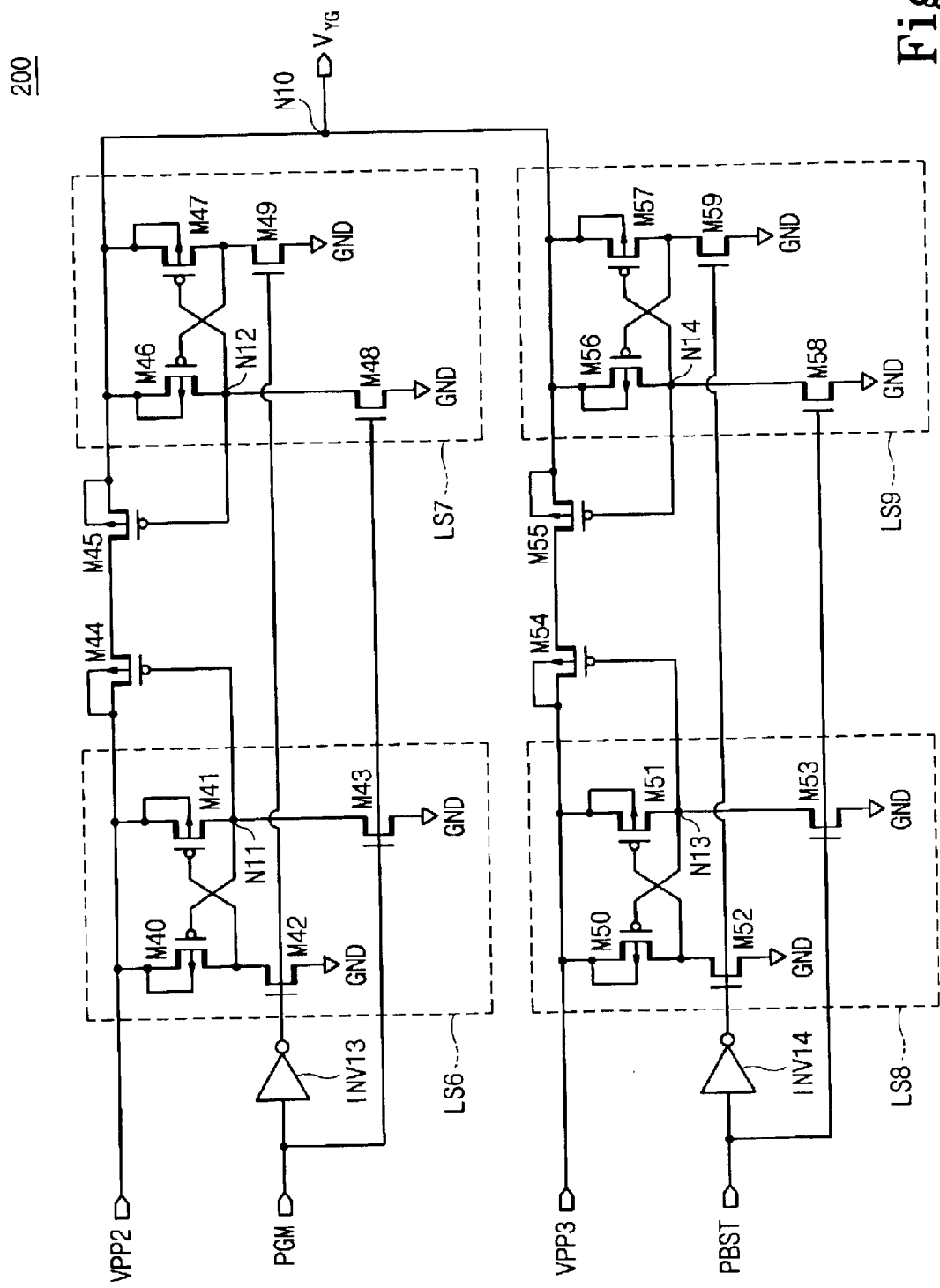
FIG. 8 is a circuit diagram of a second switch circuit shown in FIG. 3.

Referring to FIG. 8, the column-gating voltage switch circuit 200 also employs HVMOS transistors M40~M59 to transfer the high-voltage VPP2 or VPP3 to the column-gating voltage $V_{YG}$, being constructed similarly to that of the wordline voltage switch circuit 190 of FIG. 7. In other words, it is formed of an inverter IWV13 converting the program signal PGM to its complementary logic level, a level shifter LS6 connected between VPP2 and GND and responding to the program signal RD, a level shifter LS7 connected between VPP2 and GND and responding to the program signal PGM, HVPMOS transistors M44 and M45 connected in series between the VPP2 and an output terminal N10 from which the column-gating voltage $V_{YG}$ is output, an inverter INV14 converting the boosting signal PBST to its complementary logic level, a level shifter LS8 connected between VPP3 and GND and responding to the boosting signal PBST, a level shifter LS9 connected between VPP3 and GND and responding to the boosting signal PBST, and HVPMOS transistors M54 and M55 connected in series between the VPP3 and the output terminal N10.

Gates of the HVPMOS transistors M44 and M45 are coupled to output nodes N11 and N12 of the level shifters LS6 and LS7, respectively. Gates of the HVPMOS transistors M54 and M55 are coupled to output nodes N13 and N14 of the level shifters LS8 and LS9, respectively.

When the program signal PGM is active with a high level, the HVPMOS transistors M44 and M45 are turned on each by the level shifters LS6 and LS7. Then, the program voltage VPP2 is transferred to the row decoder 120 through the conductive HVPMOS transistors M44 and M45 as the column-gating voltage $V_{YG}$. During this time, as the boosting signal PBST is inactive with a low level, VPP3 cannot affect the column-gating voltage $V_{YG}$ because the HVPMOS transistors M54 and M55 are in non-conductive states. In contrast, when the boosting voltage PBST is active with a high level, the HVPMOS transistors M54 and M55 are turned on respectively by the level shifters LS8 and LS9. Then, VPP3 is transferred to the row decoder 120 through the conductive HVPMOS transistors M54 and M55 as the column-gating voltage $V_{YG}$. During this time, as the program signal PGM is inactive with a low level, VPP2 cannot affect the column-gating voltage $V_{YG}$ because the HVPMOS transistors M44 and M45 are in non-conductive states.

Next will be described the overall operation for supplying and switching the wordline voltage $V_{WL}$ and the column-gating voltage $V_{YG}$ by reference with FIGS. 3 through 8. Before programming, it will be understood that an erasure operation in the memory cell array 110 shown in FIG. 3 is carried out by applying the voltage of −10V to wordlines belonging to a page or a sector of the memory cell array.

At the beginning of a program operation mode, the program signal PGM is set to a high level while the read signal RD and the boosting signal PBST are set at low levels. The high-level program signal PGM activates the program voltage generator 170 to produce a program voltage VPP2 of 10V. Then, the switch circuit 190 transfers VPP2 into the row decoder 120 as the wordline voltage $V_{WL}$ in response to the program signal PGM while the switch circuit 200 transfers VPP2 to the column decoder 140 as the column-gating voltage $V_{YG}$ in response to the program signal PGM.

The row decoder 120 selects a wordline (e.g., WL1) in response to a corresponding row address assigned to the wordline. The wordline voltage $V_{WL}$ of VPP2 is applied to the selected memory cells through the selected wordline. At the same time, the column decoder 140 selectively activates a column selection signal (e.g., Y1) in response to a column address assigned thereto. The column-gating voltage $V_{YG}$ of VPP2 is applied to gates of the column gates T11, T12, . . . , and T1m. Then, selected bitlines (e.g., BL1, BL4, . . . ) are connected to the write drivers in the SA/WD block 150 and charged up to the drain voltage of 5~6V for programming through the conductive column gates by the active column selection signal. The column-gating voltage of VPP2 applied to the column gates enables transfer of the drain voltage to the bitlines without voltage loss from the level of 5~6V, for a successful programming result. As a result, the selected memory cell MC biased by the program voltage VPP2 is programmed such that negative charges (i.e., electrons) migrate to the floating gate, increasing the threshold voltage.

In a read operation, both the read signal RD and the boosting signal PBST are active with high levels while the program signal PGM is held at a low level. The read signal RD activates the read voltage generator 160 to create the read voltage VPP1 of 4.5 V while the boosting signal PBST does the voltage booster 180 to generate the boosting voltage VPP3 of VCC+Vth. Then, the switch circuit 190 transfers VPP1 to the row decoder 120 as the wordline voltage $V_{WL}$ in response to the read signal RD while the switch circuit 200 transfers VPP3 to the column decoder 140 as the column-gating voltage $V_{YG}$ in response to the boosting signal PBST.

The row decoder 120 selects a wordline (e.g., WL1) in response to a corresponding row address assigned to the wordline. The wordline voltage $V_{WL}$ of VPP1 is applied to the control gates of the selected memory cells through the selected wordline. At the same time, the column decoder 140 selectively activates a column selection signal (e.g., Y1) in response to a column address assigned thereto. The column-gating voltage $V_{YG}$ of VPP3 is applied to gates of the column gates T11, T12, . . . , and T1m. Then, selected bitlines (e.g., BL1, BL4, . . . ) are connected to the sense amplifiers in the SA/WD block 150. As a result, the sense amplifiers detect the present states of the selected memory cells MC by sensing voltages on the bitlines. The column-gating voltage of VPP3 applied to the column gates, VCC+Vth, prevents voltage drops of the bitline voltages to be detected in the sense amplifiers. During the read operation, the programmed memory cell retains a non-conductive state, due to a higher threshold voltage, for the wordline voltage $V_{WL}$ of VPP1. Concurrently, a voltage on a bitline connected to the memory cell increases to cause the sense amplifier to determine that the memory cell is programmed.

As aforementioned, the column gates connect the bitlines to the sense amplifier or the write drivers in response to the high voltages in order to transfer voltages at higher speed during a read operation or a programming operation. The high voltages applied to the control electrodes of the NVN-MOS transistors as column gates are advantageous to prevent a voltage loss of the bitline voltage or the drain voltage. The high voltages VPP1, VPP2, and VPP3 are generated from the generators 160, 170, and 180, respectively, by means of charge pumps. Thus, even while the power supply voltage VCC becomes lower, the high voltages can be established and maintained. As a result, operation of the NOR flash memory of the present invention is not degraded with increased operating speed during a read operation or a programming operation because the drivability of the HVNMOS-type column gates is enhanced by the high voltages provided therein.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A nonvolatile memory comprising:
   a memory cell array composed of memory cells arranged in a matrix of wordlines and bitlines;
   a row decoder configured to select one of the wordlines in response to a row address;
   a column decoder configured to generate column selection signals in response to column addresses;
   a column gate circuit configured to select a portion of the bitlines in response to the column selection signals;
   a first circuit for supplying a first high voltage to the selected wordline through the row decoder; and
   a second circuit for supplying a second high voltage to the column decoder, wherein the second high voltage is less than the first high voltage and greater than a power supply voltage, wherein one or more of the column selection signals is charged up to the second high voltage.

2. The nonvolatile memory of claim 1, wherein the column gate circuit comprises;
   high-voltage specified NMOS transistors connected to the bitlines, the high-voltage specified NMOS transistors responding to the column selection signals of the second high voltage.

3. The nonvolatile memory of claim 2, wherein the second high voltage is at least approximately VCC +Vth, wherein VCC is a power supply voltage and Vth is a threshold voltage of the high-voltage specified NMOS transistor.

4. A nonvolatile memory comprising:
   a memory cell array including memory cells arranged in a matrix of wordlines and bitlines;
   a row decoder for selecting one of the wordlines in response to a row address;
   a column decoder for generating column selection signals in response to column addresses;
   a column gate circuit for selecting a portion of the bitlines in response to the column selection signals;
   a first voltage generator for generating a first high voltage in response to a read signal;
   a second voltage generator for generating a second voltage, higher than the first high voltage, in response to a program signal;
   a voltage booster for generating a third high voltage, higher than a power supply voltage and lower than the first high voltage, in response to a boosting signal that is active during a read operation;

a first switch circuit for transferring an alternative one of the first and second high voltages to the row decoder as a wordline voltage in response to one of the read and program signals; and a second switch circuit for transferring an alternative one of the second and third high voltages to the column decoder as a column-gating voltage in response to one of the program and boosting signals.

5. The nonvolatile memory of claim 4, wherein the memory cells are stacked gate transistors.

6. The nonvolatile memory of claim 4, wherein at least one of the column selection signals is charged up to the third high voltage during the read operation.

7. The nonvolatile memory of claim 4, wherein the first switch circuit transfers the first high voltage to the row decoder as the wordline voltage while the second switch circuit transfers the third high voltage to the column decoder as the column-gating voltage, when the read signal is active.

8. The nonvolatile memory of claim 4, wherein the first switch circuit transfers the second high voltage to the row decoder as the wordline voltage while the second switch circuit transfers the second high voltage to the column decoder as the column-gating voltage, when the program signal is active.

9. The nonvolatile memory of claim 4, wherein the column gate circuit comprises high-voltage specified NMOS transistors connected to the bitlines, the high-voltage specified NMOS transistors responding to the column selection signals of the second high voltage.

10. The nonvolatile memory of claim 9, wherein the third high voltage is at least approximately VCC +Vth, wherein VCC is a power supply voltage and Vth is a threshold voltage of the high-voltage specified NMOS transistor.

11. A nonvolatile memory comprising:

a memory cell array including memory cells arranged on a matrix of wordlines and bitlines;

a row decoder for selecting one of the wordlines in response to a row address;

a column decoder for generating column selection signals in response to column addresses;

a column gate circuit for selecting a portion of the bitlines in response to the column selection signals;

a first voltage generator for generating a first high voltage in response to a read signal;

a second voltage generator for generating a second voltage, higher than the first high voltage, in response to a program signal;

a voltage booster for generating a third high voltage, higher than a power supply voltage and lower than the first high voltage, in response to a boosting signal that is active during a read operation;

a first switch circuit for transferring an alternative one of the first and second high voltages to the row decoder as a wordline voltage in response to one of the read and program signals; and a second switch circuit for transferring an alternative one of the second and third high voltages to the column decoder as a column-gating voltage in response to one of the program and boosting signals;

wherein the third high voltage is at least approximately VCC +Vth, wherein VCC is a power supply voltage and Vth is a threshold voltage of a high-voltage specified NMOS transistor.

12. The nonvolatile memory of claim 11, wherein at least one of the column selection signals is charged up to the third high voltage during the read operation.

13. The nonvolatile memory of claim 11, wherein the first switch circuit transfers the first high voltage to the row decoder as the wordline voltage while the second switch circuit transfers the third high voltage to the column decoder as the column-gating voltage, when the read signal is active.

14. The nonvolatile memory of claim 11, wherein the first switch circuit transfers the second high voltage to the row decoder as the wordline voltage while the second switch circuit transfers the second high voltage to the column decoder as the column-gating voltage, when the program signal is active.

* * * * *

UNITED STATES PATENT AND TRADEMARK OFFICE
CERTIFICATE OF CORRECTION

PATENT NO.    : 6,762,959 B2  
DATED         : July 13, 2004  
INVENTOR(S)   : Kim It is certified that error appears in the above-identified patent and that said Letters Patent is hereby corrected as shown below:

Column 1,  
Line 67, "(e.g., +5~6V)" should read -- (e.g., +5~+6V) --.

Column 6,  
Line 23, "invertor IWV13 converting" should read -- inverter INV13 converting --.

Column 8,  
Line 40, "circuit comprises; high-voltage" should read -- circuit comprises: high-voltage --.

Signed and Sealed this

Twenty-fourth Day of May, 2005

JON W. DUDAS  
*Director of the United States Patent and Trademark Office*